United States Patent [19]
Akami

[11] Patent Number: 5,544,015

[45] Date of Patent: Aug. 6, 1996

[54] PRINTED CIRCUIT BOARD

[75] Inventor: Noboru Akami, Yokohama, Japan

[73] Assignee: Nikon Corporation, Tokyo, Japan

[21] Appl. No.: 132,967

[22] Filed: Oct. 7, 1993

[30] Foreign Application Priority Data

Oct. 9, 1992 [JP] Japan .................. 4-070544 U

[51] Int. Cl.$^6$ .................................................. H05K 1/00
[52] U.S. Cl. .................. 361/749; 361/748; 361/752; 361/800; 174/35 R; 200/50.02
[58] Field of Search .................................. 361/748, 749, 361/752, 810, 816, 800, 728, 736; 200/500 A, 269, 265; 174/35 MS, 35 R; 257/659, 660

[56] References Cited

U.S. PATENT DOCUMENTS 4,683,519  7/1987  Murakami ........................ 361/424

FOREIGN PATENT DOCUMENTS 0135535A  2/1989  Japan .

Primary Examiner—Leo P. Picard
Assistant Examiner—Y. Whang

[57] ABSTRACT

A camera having a printed circuit board with edge portions which are folded for a predetermined length between support members. One of the folded portions contacts a contact portion of the camera to provide additional support for the printed circuit board.

13 Claims, 3 Drawing Sheets

PRINTED CIRCUIT BOARD

BACKGROUND OF THE INVENTION

1. Field of the Invention

The present invention relates to a printed circuit board which can be formed three-dimensionally.

2. Related Background Art

Since a printed circuit board comprises a thin plate, it may be bent when a depression switch mounted thereon is actuated, so that secure on-off operation cannot be assured. Also such board bending may lead to damage to the electronic component mounted on the circuit board, by eventual contact with other components, detachment of terminals of such electronic component, or breakage of the wirings formed on the circuit board. Breakage of the circuit board itself may occur.

For this reason, the board bending has conventionally been reduced by the reinforcement of the board itself, for example by change of the board material or increase in the board thickness. Also attempts have been made to reduce the board bending by increasing the supporting positions of the board or the supporting area thereof.

However, the change in the material or thickness of the circuit board itself is not too effective if the size of the circuit board is large, and may lead to an increase in the weight and cost of the board.

Also, the increase in the number of supporting positions of the board or in the supporting area thereof is encountered by the following difficulties.

In the equipment employing the printed circuit board, the supporting parts may not necessarily be provided at desired positions because of spatial limitation.

Also, the board designing becomes difficult, in order to provide the supporting parts in suitable positions.

Furthermore, the increased number of supporting parts on the printed circuit board is against space saving, and is disadvantageous for component mounting, since such electronic components or wirings cannot be placed on such supporting parts.

SUMMARY OF THE INVENTION

An object of the present invention is to provide a printed circuit board capable of preventing the bending thereof by an external force, without changing the material or thickness of the board.

According to the present invention, the bending of the printed circuit board itself by the external force can be prevented by folding the edge of the board.

DESCRIPTION OF THE PREFERRED EMBODIMENT

Figure 1:
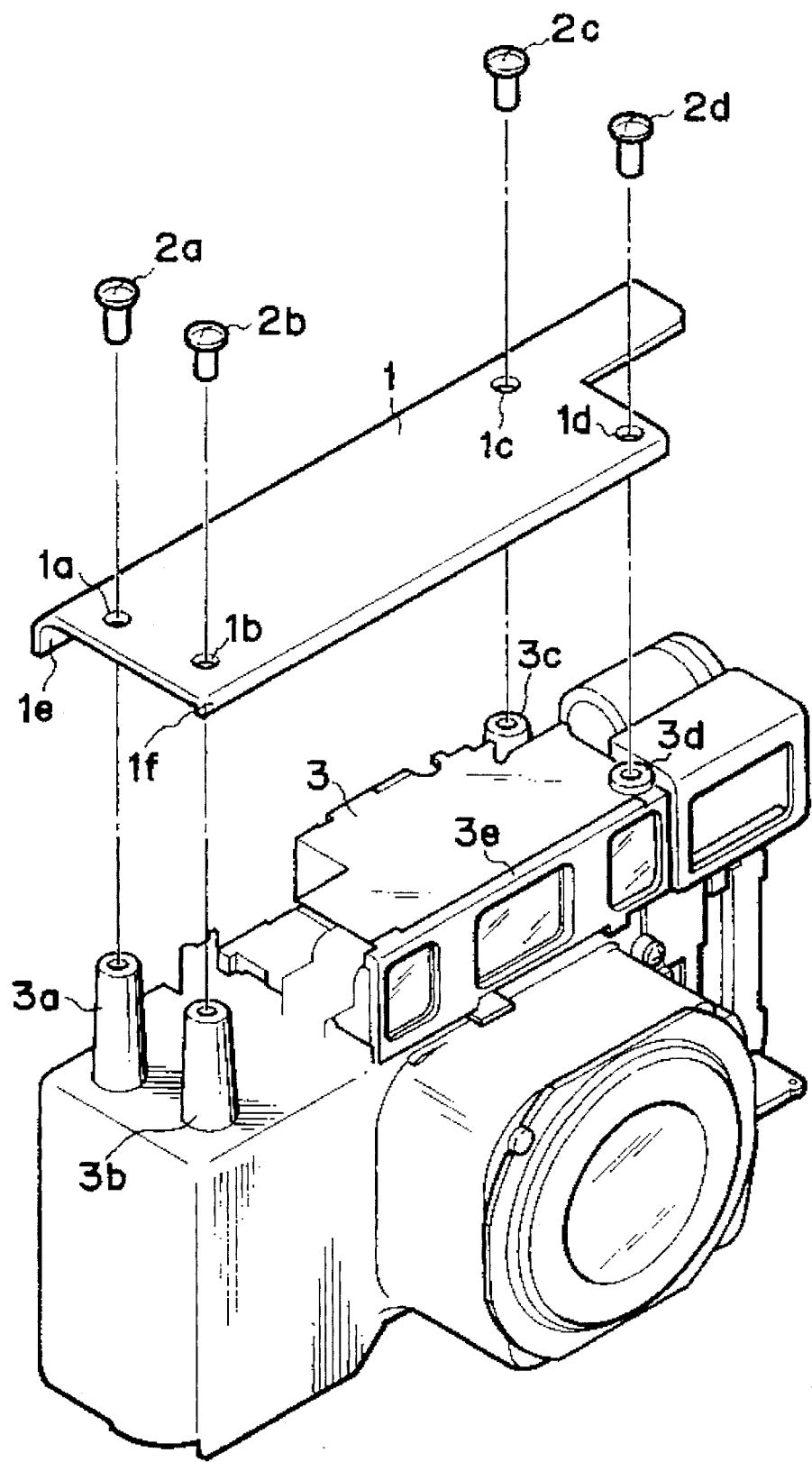
FIG. 1 is a perspective view of a camera equipped with a printed circuit board embodying the present invention.

FIG. 1 shows, in a camera, the location of the printed circuit board embodying the present invention.

A camera member 3 supports an electronic flash, an auto focus/finder block a lens barrel etc. On the camera member 3 there are provided pins 3a to 3d for supporting the printed circuit board.

The printed circuit board 1 is provided thereon with conductive wiring patterns (not shown), and various electronic components such as resistors, capacitors, IC's, etc., are fixed thereon by soldering. The printed circuit board 1 is supported on the pins 3a to 3d, by means of holes 1a to 1d formed on the board 1 and screws 2a to 2d.

Figure 2A:
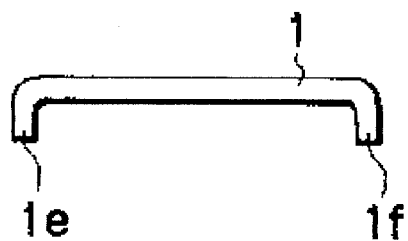
FIGS. 2A and 2B are detailed views of the printed circuit board shown in FIG. 1.
Figure 2B:
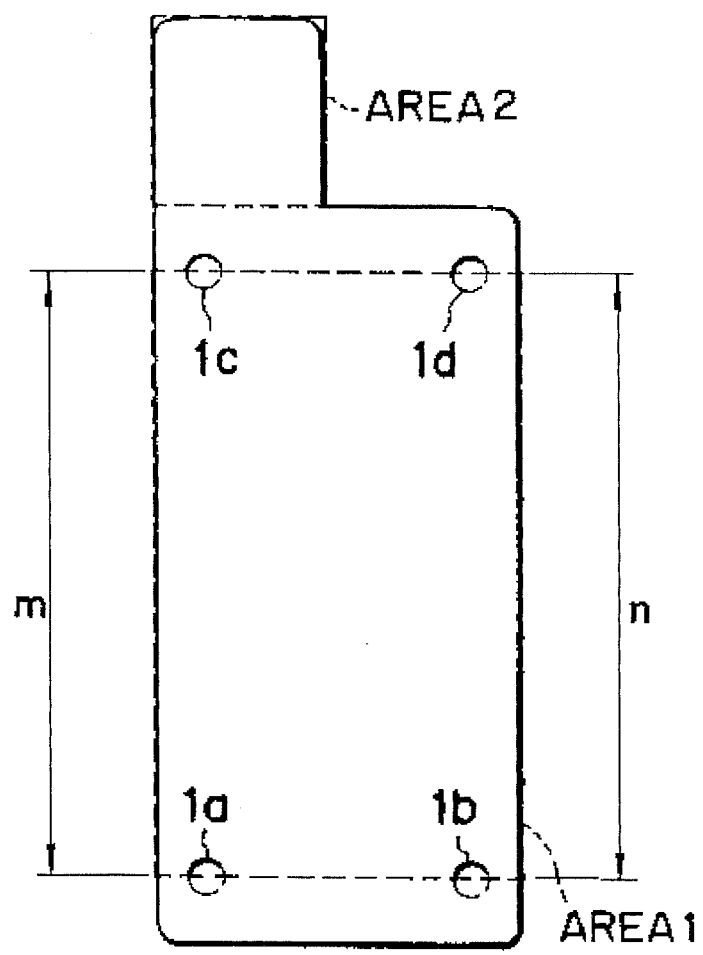

FIGS. 2A and 2B are respectively a lateral view, seen from a shorter side of the board 1, and a plan view, showing the details of the printed circuit board 1 shown in FIG. 1.

As shown in FIG. 2A, the printed circuit board 1 is provided with folded portions 1e, 1f, formed by folding the longitudinal edges of the board 1 by 90°. The edge of the folded portion if is so positioned as to contact a portion 3e of the camera member 3 shown in FIG. 1, and such contact further reduces the board bending. The folded portion 1e is extended somewhat longer, as it does not contact other members.

Referring to FIG. 2B, the printed circuit board 1 receives the force of a switch 5, to be explained later (and shown in FIG. 3), in an area 1.

The folded portion 1e is formed continuously and longer than a section m between the holes 1a and 1c (or between the supporting pins 3a and 3d). Also the folded portion 1f is likewise formed continuously and longer than a section n between the holes 1b and 1d (or between the supporting pins 3b and 3d). This is because the folded portion 1e or 1f can prevent bending if the length of the folded portion 1e or 1f is at least slightly shorter than the section m or n, but it can no longer prevent the bending if the respective length thereof is significantly shorter than said section m or n. The length of the folded portion 1e or 1f needs only to be substantially equal to the length of the section m or n. Consequently, such folded portions 1e, 1f need not be provided outside the area 1, namely in the area 2.

The folded portion 1e is formed parallel to the line connecting the supporting pins 3a and 3c, but such parallel configuration is not limitative. The same applies also to the folded portion 1f.

Figure 3:
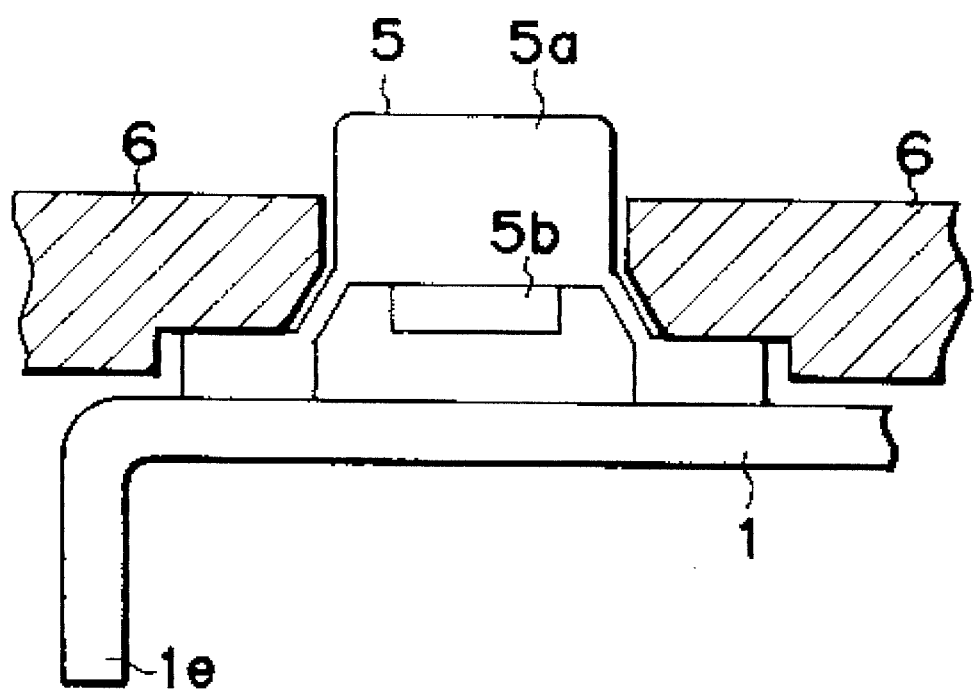
FIG. 3 is a view of a switch provided on the printed circuit board shown in FIG. 1 and which is turned on and off by depression.

FIG. 3 shows a switch 5 which is provided on the printed circuit board 1 shown in FIG. 1 and is turned on and off by depression.

Referring to FIG. 3, the switch 5 is comprises a rubber member 5a and a conductive rubber member 5b, and, when the rubber member 5a is depressed, the switch is turned on by the contact of the conductive rubber member 5b with an exposed conductive pattern (not shown) on the printed circuit board 1.

An external cover 6, covering the camera member 3, is provided with a hole through which the rubber member 5 protrudes externally for enabling the depressing operation for turning on and off the switch 5.

The switch 5 is provided in the vicinity of the folded portion 1e or 1f within the area 1 shown in FIG. 2B, because the switch 5 is affected by the board bending in the shorter direction thereof if it is positioned at the center of the board.

The folded portions 1e, 1f on the printed circuit board 1 ensure the secure switching operation of the switch 5, because the board 1 is bent little by the depression on the switch 5.

As explained above, the presence of the folded portions 1e, 1f on the board 1 allows for a reduction in the number of supporting pins for the board and the supporting area thereof, thereby increasing the effective space of the camera member 3 and achieving compactness and lighter weight. Also, the designing of the board 1 can be facilitated.

Also, in the printed circuit board 1 itself, the reduced supporting areas provide a larger effective space, as in the case of the camera member 3, thereby facilitating the designing and achieving compactness and lighter weight.

Thus, the folded portions 1e, 1f can reinforce the printed circuit board against the bending thereof in the longitudinal direction. Naturally, the reinforcement in the shorter direction is also possible by forming similar folded portions in the shorter ends. It is also possible to provide only one folded portion, or to provide a folded portion in each of the longitudinal end and the shorter end.

Furthermore, though the folded portions 1e, 1f of the foregoing embodiment do not have enough areas for mounting electronic components, they may be expanded in areas to mount such components thereon.

As explained in the foregoing, the present invention allows for an increase in the rigidity of the printed circuit board against external forces, without varying the thickness or material of the board itself. Such increased rigidity allows for a reduction in the number of the supporting parts of the printed circuit board and supporting areas thereof, thereby contributing to space saving and weight reduction in the camera.

What is claimed is:

1. A printed circuit board supported by first and second support members and subjected to an external force applied by a depression switch positioned between said first and second support members, wherein an edge portion of said board is folded for a predetermined length between said first and second support members substantially at least as large as a distance between said first and second support members.

2. A printed circuit board according to claim 1, wherein said folded portion is substantially parallel to a line connecting said first and second support members.

3. A printed circuit board comprising:
   a printed substrate on which electronic components are mounted;
   first and second support members for supporting said printed substrate; and
   a depression member which applies a depression force to said printed substrate, the depression member being arranged at a position at which the depression member is not supported by said support members, and wherein said printed substrate is folded at least the length between said first and second support members.

4. A camera having electronic components, the camera comprising:
   a printed circuit board on which the electronic components are mounted and having first and second edges opposite each other;
   first and second support members, arranged adjacent to said first edge, for supporting said printed circuit board; and
   a depression member to apply a depression force to said printed circuit board between said first and second support members;
   wherein said printed circuit is folded at said first edge, forming a first folded portion between said first and second support members.

5. A camera as claimed in claim 4, wherein said first folded portion is perpendicular to a surface of the remainder of said printed circuit board.

6. A camera as claimed in claim 6, wherein:
   said first and second support members contact said surface of the remainder of said printed circuit board; and
   said first folded portion contacts a portion of a camera body of the camera spaced apart from said first and second support members.

7. A camera as claimed in claim 4, wherein said first edge is parallel to a line connecting said first and second support members.

8. A camera as claimed in claim 4, further comprising third and fourth support members, arranged adjacent to said second edge, for supporting said printed circuit board, wherein said printed circuit board is folded at said second edge, forming a second folded portion between said third and fourth support members.

9. A camera as claimed in claim 8, wherein said depression member applies the depression force between said third and fourth support members.

10. A camera as claimed in claim 8, wherein each of said first through fourth support members comprises:
    a protuberance having a thread formed in a camera body; and
    a screw which passes through said printed circuit board and is received by said thread.

11. A camera as claimed in claim 8, wherein said first and second folded portions are parallel to each other and perpendicular to a surface of the remainder of said printed circuit board.

12. A camera as claimed in claim 11, wherein:
    said first through fourth support members contact said surface of the remainder of said printed circuit board; and
    said first folded portion contacts a portion of a camera body of the camera spaced apart from said first through fourth support members.

13. A camera as claimed in claim 8, wherein said first edge is parallel to a line connecting said first and second support members and said second edge is parallel to a line connecting said third and fourth support members.

* * * * *

UNITED STATES PATENT AND TRADEMARK OFFICE
CERTIFICATE OF CORRECTION

PATENT NO. : 5,544,015
DATED : August 6, 1996
INVENTOR(S) : AKAMI

It is certified that error appears in the above-indentified patent and that said Letters Patent is hereby corrected as shown below:

Column 4, Claim 6, line 13, change "6" to --5--.

Signed and Sealed this

Twenty-first Day of January, 1997

Attest:

BRUCE LEHMAN

Attesting Officer

Commissioner of Patents and Trademarks